United States Patent [19]

Hirose

[11] 4,374,358

[45] Feb. 15, 1983

[54] APPARATUS FOR MEASURING THE OSCILLATION FREQUENCY OF A VOLTAGE CONTROLLED OSCILLATOR

[75] Inventor: Masaaki Hirose, Gyoda, Japan

[73] Assignee: Takeda Riken Kogyo Kabushiki Kaisha, Tokyo, Japan

[21] Appl. No.: 222,663

[22] Filed: Jan. 5, 1981

[30] Foreign Application Priority Data

Jan. 9, 1980 [JP] Japan ................................. 55-1478

[51] Int. Cl.³ .......................................... G01R 23/02
[52] U.S. Cl. ............................. 324/78 D; 324/79 R; 324/77 B
[58] Field of Search ............... 324/77 B, 77 G, 78 R, 324/78 D, 78 F, 78 Z, 79 R, 82, 83 R, 83 A, 83 FE; 331/25; 328/133

[56] References Cited

U.S. PATENT DOCUMENTS 3,978,403  8/1976  Mansfield .......................... 324/79 R
4,151,463  4/1979  Kibler .................................. 331/25

*Primary Examiner*—Michael J. Tokar
*Attorney, Agent, or Firm*—Staas & Halsey

[57] ABSTRACT

The apparatus of the present invention is provided with a reference oscillator having an oscillation frequency lower than the oscillation frequency of a voltage controlled oscillator to be measured. Either reference oscillator or the oscillator to be measured is controlled by a phase lock loop so that a difference between a frequency N times the oscillation frequency of the reference oscillator and the oscillation frequency of the voltage controlled oscillator may assume a predetermined value. A coarse oscillation frequency of the voltage controlled oscillator is obtained from its control voltage. The oscillation frequency of the reference oscillator is counted by a counter and the coarse frequency is divided by the count value and then an integer value is obtained by rounding off the divided result. The count value of the counter is multiplied by the divided result to obtain a highly accurate oscillation frequency value for the voltage controlled oscillator with high accuracy.

9 Claims, 5 Drawing Figures

APPARATUS FOR MEASURING THE OSCILLATION FREQUENCY OF A VOLTAGE CONTROLLED OSCILLATOR

BACKGROUND OF THE INVENTION

The present invention relates to apparatus for measuring the oscillation frequency of a voltage controlled oscillator for use as a first local oscillator of a spectrum analyzer, in particular, a voltage controlled oscillator whose oscillation frequency is as high as several gigahertz.

In a spectrum analyzer for measuring an input signal of a high frequency, the frequency of a first local signal which is employed for converting the input signal frequency to a first intermediate frequency (e.g., a 4 GHz signal) is varied, for example, in the range of 50 to 200 GHz. As a voltage controlled oscillator which oscillates at such a high frequency and whose oscillation frequency can be controlled by a voltage, use is made of, for instance, a YIG oscillator. To measure the input signal frequency in the spectrum analyzer, it is necessary to measure the frequency of its first local signal. In order to measure the oscillation frequency of an oscillator of such a high frequency, however, a special frequency measuring apparatus using many ultra-high-frequency elements is needed, and because of this, the measurement becomes markedly expensive. In view of this, it is the common practice in the prior art to measure a control voltage of the voltage controlled oscillator and obtain the corresponding oscillation frequency from the measured result. With such a method, however, a frequency of several gigahertz can be measured only with an accuracy of 1 to 1 MHz, that is, with an accuracy of only three digits.

SUMMARY OF THE INVENTION

Accordingly, it is an object of the present invention to provide an oscillation frequency measuring apparatus which is capable of measuring the oscillation frequency of even a voltage controlled oscillator having a high oscillation frequency with high accuracy by using zero or a small number of ultra-high-frequency elements.

Another object of the present invention is to provide a frequency measuring apparatus which is capable of measuring the oscillation frequency of a first local oscillator of a spectrum analyzer with high accuracy.

According to the present invention, a reference oscillator which has an oscillation frequency lower than the oscillation frequency of a voltage controlled oscillator to be measured, is provided. The reference oscillator or the oscillator to be measured is controlled by a phase lock loop so that a difference between a frequency N times the oscillation frequency of the reference oscillator and the oscillation frequency of the voltage controlled oscillator assumes a predetermined value. In the phase lock loop, the output from the reference oscillator is rendered into sampling pulses; the output from the voltage controlled oscillator is sampled by the sampling pulses; the sampled output is filtered by a low-pass filter; and the reference oscillator or the voltage controlled oscillator is controlled by the filtered output, so that the above-mentioned predetermined value may become zero. Alternatively, in the phase lock loop, the output from the reference oscillator is frequency-multiplied by a high frequency generating type frequency multiplier; the multiplied output and the oscillation output from the voltage controlled oscillator are frequency-mixed; the output of a difference frequency between them and a reference signal whose frequency has the above-mentioned predetermined value are phase-compared by a phase comparator; and the reference oscillator or the voltage controlled oscillator is controlled by the compared output, so that the frequency of the difference frequency output may assume a predetermined value. The oscillation frequency of the voltage controlled oscillator is derived from a control voltage which controls the oscillation frequency. The frequency thus obtained will hereinafter be referred to as a coarse frequency. The oscillation frequency of the reference oscillator is counted by a counter, the coarse frequency is divided by the count value and then an integer value obtained by rounding off the divided result and the count value of the counter are multiplied. The multiplied result is a correct oscillation frequency of the voltage controlled oscillator. As the aforementioned coarse frequency use can be made of a digital value converted from the control voltage or in the case where the control voltage is obtained by converting a digital value into an analog signal, the digital value can be used.

DESCRIPTION OF THE PREFERRED EMBODIMENTS

Figure 1:
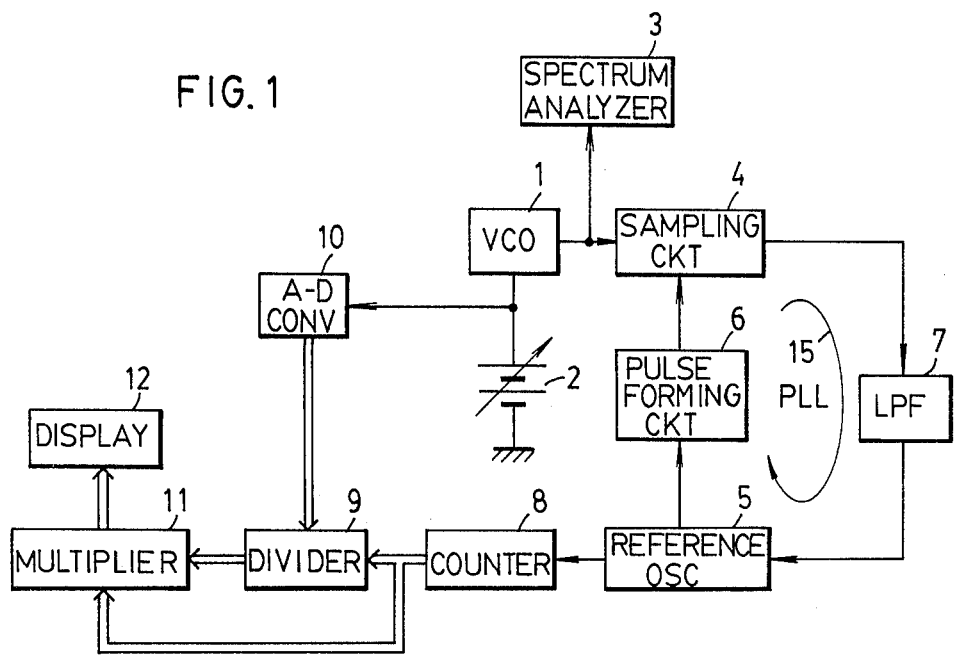
FIG. 1 is a block diagram illustrating an embodiment of the oscillation frequency measuring apparatus of the present invention, which includes a sampling circuit in the phase lock loop.

Referring first to FIG. 1, a voltage controlled oscillator 1 to be measured is one that oscillates at a high frequency and is, for example, a YIG oscillator. The oscillation frequency of the oscillator 1 is controlled by a control voltage V available from a DC voltage source 2. The oscillation signal of the oscillator 1 is applied as a local signal, for instance, to a spectrum analyzer 3 for its frequency converting operation and, at the same time, it is provided to a sampling circuit 4 in this embodiment. During measurement of its frequency, the oscillator 1 is stopped from sweeping. A pulse forming circuit 6, supplies sampling pulses to the sampling circuit 4. A signal from a reference oscillator 5, which oscillates at a frequency lower than the oscillation frequency of the oscillator 1, for example, at a frequency of about 100 MHz, is provided to the pulse forming current 6. By the sampling pulses from the pulse forming circuit 6, the oscillation signal of the oscillator 1 is sampled for the phase comparison between them. The sampled output is provided to a frequency control terminal of the reference oscillator 5 via a low-pass filter 7 including a suitable amplifier. The sampling circuit 4, the reference oscillator 5, the pulse forming circuit 6 and the low-pass filter 7 make up a phase lock loop 15. The oscillation frequency of the reference oscillator 5 is controlled follow the oscillation frequency of the oscillator 1, and a frequency N times (N being a positive integer) the oscillation frequency of the reference oscillator 5 and the oscillation frequency of the oscillator 1 become equal to each other.

The oscillation signal of the reference oscillator 5 is supplied to a counter 8, for instance, at regular time intervals for measuring the oscillation frequency of the reference oscillator 5. A counter for counting a frequency of 100 MHz or so is readily available. The count value of the counter 8 is supplied to a divider 9. In addition, the control voltage V of the DC voltage source 2 is converted, by an A-D converter 10, into a digital value, obtaining a rough estimate F' of the oscillation frequency of the oscillator 1 corresponding to the control voltage, that is, the coarse frequency. The relationship between the control voltage and the coarse frequency is predetermined. Accordingly, the A-D converter 10 is arranged so as to yield a value equal to a coefficient dependent on the above-mentioned relationship multiplied by a converted output value of an ordinary A-D converter. Since the rough estimate of the oscillation frequency of the oscillator 1, i.e. the coarse frequency obtained by the A-D converter 10, is sufficient if it has an accuracy of a sufficient number of significant digits to determine the integer N, the A-D converter 10 may be an inexpensive one having a small number of digits. The rough estimate F' of the oscillation frequency obtained by the A-D converter 10 is divided by the count value f of the counter 8. By this division, a rough estimate N', of the ratio N between the oscillation frequencies of the voltage controlled oscillator 1 and the reference oscillator 5, is obtained. Since the significant high-order digits obtained by rounding off the rough estimate N' coincide with the integer N, the correct oscillation frequency F of the oscillator 1 can be obtained by multiplying the integer N by the oscillation frequency of the reference oscillator 5.

To this end, a multiplier 11 is provided at the output side of the divider 9 and, in the multiplier 11, the count value f of the counter 8 is multiplied by the value N which represents the integer obtained by rounding off the frequency ratio N' derived from the divider 9, and the multiplied result, F=N.f, is displayed on a display 12. Since the count value obtained by the counter 8 is highly accurate, the numerical value displayed on the display 12 is the correct oscillation frequency of the oscillator 1.

As described above, according to the present invention, the phase lock loop 15 and the counter 8 can be formed by circuit elements responsive to a frequency of about 100 MHz, and hence they can be produced at low cost. In addition, since the other circuit elements 9, 10, 11 and 12 may be, for example, IC elements now available in the market, these circuit elements 9 to 12 are also inexpensive. Accordingly, the apparatus of the present invention can be produced at extremely low cost as a whole. Further, the frequency value which is displayed on the display 12 is high in accuracy. In other words, the oscillation frequency of the oscillator 1 and the control voltage correspond to each other relatively faithfully, and the synchronization accuracy of the phase lock loop 15 is high; for example, an accuracy of eight digits or so can easily be obtained. Consequently, the coarse frequency F' available from the A-D converter 10 is sufficient if the number of at least its high-order significant digits coincides with the aforementioned integer N in the phase lock loop 15. For example, if the number of the significant digits is three or so, then it is possible to determine the correct integer value N by rounding off the fraction of the rough estimate N'. This round off operation is performed by the divider 9. Thus, the result of multiplication of the correct integer value N and the oscillation frequency f of the reference oscillator 5 indicates the oscillation frequency of the oscillator 1 with high accuracy. In this way, the oscillation frequency of the microwave, voltage controlled oscillator can be measured highly accurately. In the determination of the integer value N in the above embodiment of the present invention, the rounding off can be achieved by, for example, adding 0.5 to N' and then discarding the fractions.

Figure 2:
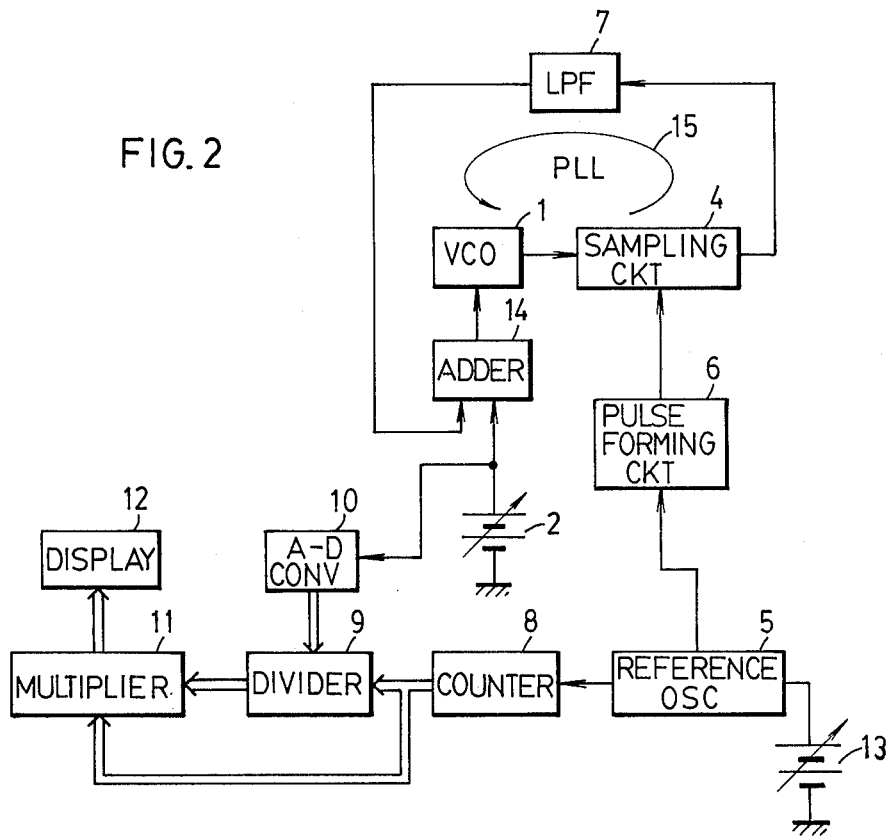
FIG. 2 is a block diagram showing a modified form of the embodiment of FIG. 1, which includes the sampling circuit in the phase lock loop.

FIG. 2 illustrates another embodiment of the present invention. In this embodiment, the oscillator 1 to be measured, the sampling circuit 4 and the low-pass filter 7 constitute the phase lock loop 15, and a reference signal is provided from the reference oscillator 5 to the phase lock loop 15. The oscillation frequency of the reference oscillator 5 can be varied, as required, by applying thereto a DC control voltage from a DC control voltage source 13. The oscillation signal of the reference oscillator 5 is applied via the pulse forming circuit 6 to the sampling circuit 4. The sampling output from the sampling circuit 4 is provided via the low-pass filter 7 to a voltage control terminal of the oscillator 1. That is, the control voltage from the DC voltage source 2 and the output from the low-pass filter 7 are added together by an adder 14 and the added output is provided to the voltage control terminal of the oscillator 1. In this arrangement, if there is a difference between the value N times the oscillation frequency f of the reference oscillator 5 and the oscillation frequency of the oscillator 1, then an error voltage corresponding to the difference is yielded from the low-pass filter 7 and, by its output, the oscillation frequency of the oscillator 1 is controlled, so that this frequency is caused to coincide with Nf. Accordingly, the oscillation frequency of the reference oscillator 5 is measured by the counter 8; the ratio N' between the count value of the counter 8 and the oscillation frequency of the oscillator 1 measured by the A-D converter 10 is calculated by the divider 9; the correct integer value N in the phase lock loop is obtained from the high-order digits of the calculation result; the integer value N and the oscillation frequency f of the reference oscillator 5 obtained by the counter 8 are multiplied; and the multiplication result is applied to the display 12. In this way, the oscillation frequency of the oscillator 1 can be displayed on the display 12. When the voltage of the control voltage source 13 is changed, the oscillation frequency of the reference oscillator 5 varies, so that the sampling output frequency of the sampling circuit 4 varies, resulting in a change in the oscillation frequency of the oscillator 1, too. Thus, the oscillation frequency of the oscillator 1 responds to the variations in the oscillation frequency of the reference oscillator 5. If the variable range of the oscillation frequency f of the reference oscillator 5 is reduced, then the oscillation frequency of the oscillator 1 to be measured can be finely controlled by the voltage adjustment of the control voltage source 13. In short, the oscillation frequency of the oscillator 1 can be coarsely adjusted by the voltage adjustment of the DC voltage source 2 and finely adjusted by the voltage adjustment of the control voltage source 13. In this case, because the variation range of the oscillation frequency of the reference oscillator 5 is narrow, the stability of this oscillation frequency can be raised higher than the oscillatiion frequency of the oscillator 1 to be measured and, by the action of the phase lock loop 15, the stability of the oscillation frequency of the oscillator 1 is raised up to the stability of the oscillation frequency of the reference oscillator 5.

Figure 3:
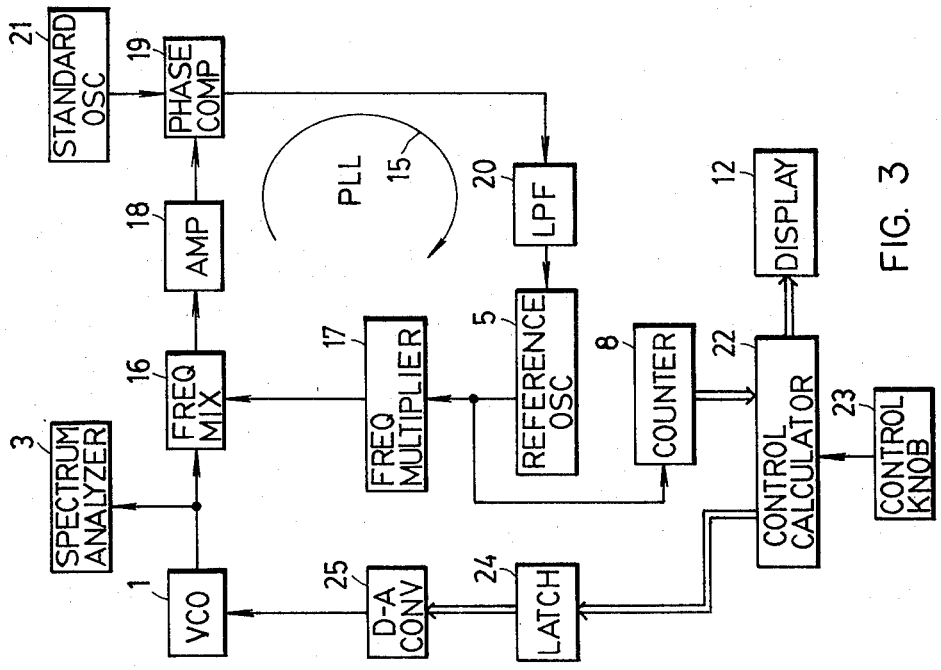
FIG. 3 is a block diagram illustrating another embodiment of the oscillation frequency measuring apparatus of the present invention, which includes a frequency mixer in the phase lock loop.

FIG. 3 illustrates another embodiment of the present invention, in which the output from the oscillator 1 to be measured is supplied to a frequency mixer 16. The output from the reference oscillator 5 is frequency-multiplied N times by a frequency multiplier 17 which is formed by a high harmonic generator, and the frequency Nf obtained at the output thereof is applied to the frequency mixer 16. The frequency mixer 16 outputs a signal comprising a difference frequency (Nf−F) between the frequencies of both inputs, and the output signal is provided to a phase comparator 19, if necessary, after being amplified by an amplifier 18. A standard signal, having a frequency $f_s$, from a standard oscillator 21, is applied to the phase comparator 19, wherein both inputs thereto are phase-compared. The output from the phase comparator 19 is provided, via the low-pass filter 20, to the reference oscillator 5 to control its oscillation frequency. As a result of this, the reference comparator 5, the frequency mixer 16, the frequency multiplier 17, the amplifier 18 and the phase comparator 19 constitute the phase lock loop 15. A difference (Nf−F) between the oscillation frequency F of the oscillator 1 and a value N times the oscillation frequency f of the reference oscillator 5 becomes equal to the standard signal frequency $f_s$ of the standard signal source 21.

This embodiment employs a control calculator 22 including a microcomputer. When a frequency control knob 23 is controlled, a control signal is applied to the control calculator 22 and, depending on whether the control is to raise or lower the frequency, 1 is added to or subtracted from a stored value F′ of a frequency memory incorporated in the control calculator 22, and the result is stored again in the memory and latched in a frequency latch 24. The content of the frequency latch 24 is converted, by a D-A converter 25, into an analog signal, which is provided as a control voltage to the control terminal of the oscillator 1. Accordingly, the oscillation frequency of the oscillator 1 can be raised or lowered by a fixed value for each movement of the frequency control knob 23. For instance, the output voltage of the D-A converter 25 can be converted in a range of 0.000 to 4.000 V and at this time, the oscillation frequency of the oscillator 1 can be varied from 4,000 to 8,000 MHz by steps of 1 MHz.

The oscillation frequency f of the reference oscillator 5 is counted by the counter 8 and the count value f is input to the control calculator 22. Although N is expressed by $N=(F+f_s)/f$, $f_s$ is selected, for convenience, to be small enough so that the term $f_s/f$ may be negligible and not affect the rounding off of N′ for determination of N. The control calculator 22 divides the stored value F′ of the built-in frequency memory to obtain $N'=F'/f$ and the rounded integral part of this N′ is multiplied by f. The multiplied result is subtracted by the standard frequency $f_s$ and the frequency F is provided to the display 12 for display thereon. The value of N to be used for multiplication represents the harmonic number of a harmonic frequency, which is phase-synchronized with the signal from the oscillator 1 and which is one of the harmonics generated by the frequency multiplier 17. In the control calculator 22, F′/f is calculated and rounded off to determine N, which is then multiplied with f and subtracted by $f_s$, thereby obtaining F with high accuracy. For example, assuming that the oscillation frequency F of the oscillator 1 is in the range of 4,000 to 8,000 MHz, as in the aforementioned numerical value example, that the standard signal frequency $f_s$ is 10 MHz and that the center oscillation frequency of the reference oscillator is 100 MHz, any one of those of the high harmonics of the frequency multiplier 17 which have harmonic orders N of 40 to 80, is synchronized with the phase lock loop 15 and the order N of the high harmonic thus synchronized is obtained by dividing the set frequency F′ by the count value f of the counter 8 and rounding off the result thereof. Since the counter 8 is for measuring a frequency of 100 MHz or so, an inexpensive counter can be used. The accuracy of the measured frequency of the oscillator 1 depends on the frequency accuracy of the standard signal source 21 and, for instance, an accuracy of about eight digits can readily be obtained. It will be seen that the measuring apparatus of the present invention is excellent as compared with the prior art in which an accuracy of only three digits or so can be obtained when measuring the oscillation frequency of the oscillator 1 from the control voltage thereof.

Figure 4:
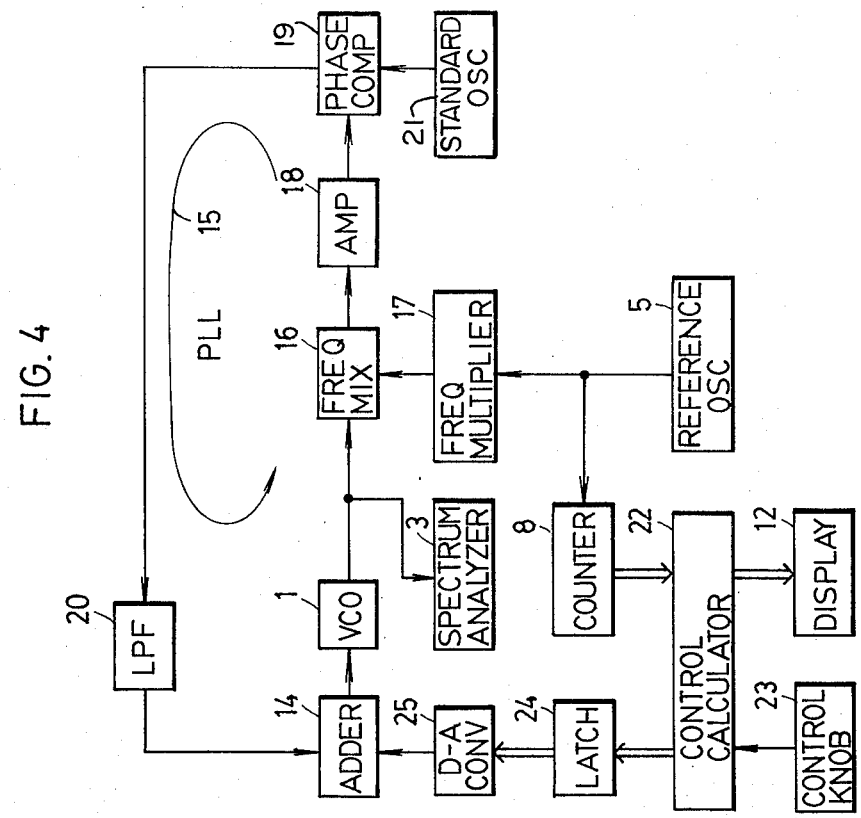
FIG. 4 is a block diagram showing a modification of the embodiment of FIG. 3, which includes the frequency mixer in the phase lock loop.

In the embodiment shown in FIG. 3, too, it is also possible to feed back the output from the phase comparator 19 to the control terminal of the oscillator 1 via an adder 14, as shown in FIG. 4. In FIGS. 3 and 4 the frequency latch 24 and the D-A converter 25 can be omitted and, the variable DC power source 2 substituted therefor and used as shown in FIGS. 1 and 2, in which the output from the DC power source 2 is supplied to the control terminal of the oscillator 1 and to the A-D converter 10 where it is converted to a frequency value for input to the control calculator 22. In this case, the control calculator 22 need not be equipped with the control function and hence has only the calculation function. In the arrangements of FIGS. 1 and 2, it is also possible to leave out the variable DC power source 2, the divider 9, the A-D converter 10 and the multiplier 11 and to employ the control calculator 22 shown in FIGS. 3 and 4. In FIGS. 3 and 4 the phase lock loop 15 can also be made so that $F-Nf=f_s$.

Figure 5:
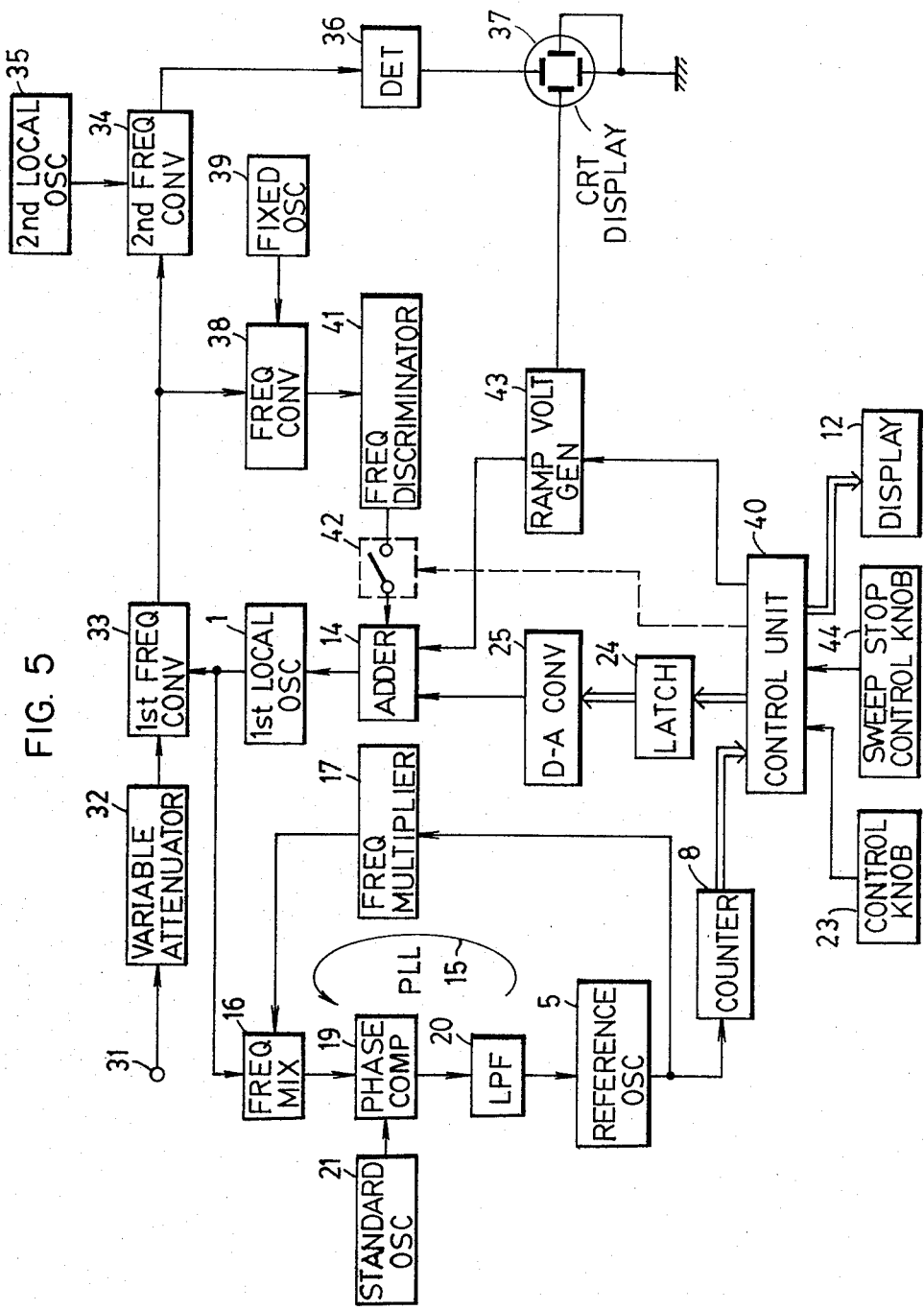
FIG. 5 is a block diagram illustrating the outline of a spectrum analyzer equipped with the oscillation frequency measuring apparatus of the present invention.

FIG. 5 illustrates an example of the application of the present invention to the display for the center frequency of the measuring frequency band, which is attained by the measurement of the oscillation frequency of a first local oscillator in a spectrum analyzer. From an input terminal 31, an input signal to be measured is applied via a variable attenuator 32 to a first frequency converter 33. In the first frequency converter 33, the input signal is frequency-converted by a local signal from a first local oscillator 1 and the converted output is provided to a second frequency converter 34, wherein it is further frequency-converted by a local signal from a second local oscillator 35. The converted output thus obtained is applied via a detector 36 to a vertical deflection input terminal of a CRT display 37. A control unit 40 is subject to control of the frequency control knob 23 and sets a frequency in the latch 24, the content of which is converted by the D-A converter 25 to an analog signal and the converted output is applied as a control voltage to the control terminal of the local oscillator 1 via the adder 14. The output from the first frequency converter 33 is also supplied to a frequency converter 38, wherein it is frequency-converted by a fixed frequency signal from a fixed oscillator 39 and the converted output is frequency-discriminated by a frequency discriminator 41. The frequency-discriminated output is applied via a switch 42 to the adder 14, constituting an automatic frequency control loop for stabilizing the oscillation frequency of the oscillator 1. When a trigger signal is provided from the control unit 40 to a ramp voltage generator 43, a ramp voltage is generated therefrom and supplied to the adder 14 and the oscillation frequency of the oscillator 1 is swept, assuming the set frequency of the frequency latch 24 as a center frequency. The ramp voltage is applied to a horizontal deflection control terminal of the display 37, too. By operating a sweep stop control knob 44, the generation of the ramp voltage is stopped. The spectrum analyzer of such an arrangement is known in the art.

The oscillation frequency of the first local oscillator 1 is measured by the frequency measuring apparatus of the present invention. The spectrum analyzer of FIG. 5 is provided with the apparatus shown in FIG. 3. In the case of measuring the frequency, the frequency sweep is stopped and the switch 42 is turned ON to stabilize the oscillation frequency of the oscillator 1. Since the frequency measurement follows the same procedure as described previously with respect of FIG. 3, no description will be repeated. The control unit 40 performs the function of the control calculator 22 explained with reference to FIG. 3. Since the frequency display 12 in the spectrum analyzer is designed to indicate the center frequency of a frequency range measurable at that time, the local oscillator 1 is stopped from sweeping, the frequency F of the local oscillator 1 at that time is obtained in the manner described previously, and a value which is obtained by subtracting the frequency of the output intermediate-frequency signal of the first frequency converter 33 from the frequency F, is displayed on the display 12. The oscillation frequency measuring apparatus of the present invention is applicable not only to the measurement of the frequency of a local signal but also to the measurement of the oscillation frequency of a frequency signal generator for measuring the frequencies of an amplifier, a filter and so forth.

It will be apparent that many modifications and variations may be effected without departing from the scope of the novel concepts of this invention.

What is claimed is:

1. Apparatus for measuring the oscillation frequency of a voltage controlled oscillator controlled by a control voltage, comprising:
    a reference oscillator having an oscillation frequency lower than the oscillation frequency of the voltage controlled oscillator to be measured;
    a phase lock loop, operatively connected to the outputs from the voltage controlled oscillator and the reference oscillator, for controlling one of the voltage controlled oscillator and said reference oscillator so that the difference between the oscillation frequency of the voltage controlled oscillator and a value N (where N is an integer) times the oscillation frequency of said reference oscillator is a predetermined value;
    a counter, operatively connected to said reference oscillator, for counting the oscillation frequency of the reference oscillator;
    approximate frequency detecting means, operatively connected to the voltage controlled oscillator, for detecting an approximate oscillation frequency approximately corresponding to the control voltage for setting the oscillation frequency of the voltage controlled oscillator;
    dividing means, operatively connected to said counter and said approximate frequency detecting means, for dividing the approximate oscillation frequency by the count value of said counter and for determining the value N from the result of the division; and
    calculating means, operatively connected to said dividing means and said counter, for obtaining the oscillation frequency of the voltage controlled oscillator, said calculating means including means for multiplying the value N obtained from said dividing means by the count value of the counter.

2. Apparatus according to claim 1, wherein said phase lock loop includes:
    a pulse forming circuit, operatively connected to said reference oscillator, for shaping the output of said reference oscillator into sampling pulses;
    a sampling circuit, operatively connected to said pulse forming circuit and the voltage controlled oscillator, for sampling the output from the voltage controlled oscillator by sampling pulses;
    a low-pass filter, operatively connected between said sampling circuit and said reference oscillator, wherein the oscillation frequency of said reference oscillator is controlled by the filtered output of said low-pass filter to reduce the predetermined value to zero.

3. Apparatus according to claim 1, further comprising a pulse forming circuit, operatively connected to said reference oscillator, for shaping the output of said reference oscillator into sampling pulses, wherein said phase lock loop includes:
    a sampling circuit, operatively connected to said pulse forming circuit and the voltage controlled oscillator, for sampling the output from the voltage controlled oscillator; and
    a low-pass filter, operatively connected between said sampling circuit and the voltage control oscillator, wherein the oscillation frequency of the voltage controlled oscillator is controlled by the filtered output of said low-pass filter to reduce the predetermined value to zero.

4. Apparatus according to claim 1, further comprising a standard oscillator, wherein said phase lock loop includes:
    a high harmonics generating type frequency multiplier, operatively connected to said reference oscillator, for multiplying the output of said reference oscillator;
    a frequency mixer, operatively connected to the outputs of said frequency multiplier and the voltage controlled oscillator, for obtaining an output which is the difference frequency between them;
    a phase comparator, operatively connected to said standard oscillator and said frequency mixer, for frequency comparing the dfference frequency output and a standard signal of a frequency of the predetermined value, wherein the oscillation frequency of said reference oscillator is controlled by the phase-compared output to cause the difference frequency output and the standard signal to coincide with each other in frequency.

5. Apparatus according to claim 1, further comprising a standard signal source and a high harmonics generating type frequency multiplier, operatively connected to said reference oscillator, for multiplying the output of said reference oscillator;

a frequency mixer, operatively connected to said frequency multiplier and the voltage controlled oscillator, for obtaining a difference frequency between them;

a phase comparator, operatively connected to said standard signal source and said frequency mixer, for phase comparing the difference frequency output and a standard signal of a frequency of the predetermined value, wherein the oscillation frequency of the voltage controlled oscillator is controlled by the phase- compared output to cause the difference frequency output and the standard signal to coincide with each other in frequency.

6. Apparatus according to claim 1, 2, 3, 4 or 5, wherein said approximate frequency detecting means is an A-D converter for converting the control voltage to a digital value corresponding to the oscillation frequency of the voltage controlled oscillator.

7. Apparatus according to any one of claim 1, 2, 3, 4 or 5, further comprising frequency setting means for storing the frequency of the voltage controlled oscillator as a control digital value and means for converting the control digital value to an analog control voltage for controlling the oscillation frequency of the voltage controlled oscillator, wherein said approximate frequency detecting means comprises means for obtaining the oscillation frequency of the voltage controlled oscillator from the control digital value.

8. Apparatus according to claim 3 or 5, further comprising means for controlling the oscillation frequency of said reference oscillator.

9. Apparatus according to claim 7, wherein said dividing means and said calculating means are formed by a control calculator having incorporated therein a microcomputer, and wherein the control calculator sets the control digital value in said frequency setting means in response to the control of said frequency control means.

* * * * *

UNITED STATES PATENT AND TRADEMARK OFFICE
CERTIFICATE OF CORRECTION

PATENT NO. : 4,374,358
DATED : FEBRUARY 15, 1983
INVENTOR(S) : MASAAKI HIROSE

It is certified that error appears in the above-identified patent and that said Letters Patent is hereby corrected as shown below:

```
Front page, [57] ABSTRACT, line 18, delete "with high
                  "accu-";
                  line 19, delete "racy".

Col. 2, line 58, delete ",".
Col. 3, line 4, after "controlled" insert --to--.
Col. 8, line 60, "dfference" should be --difference--.
```

Signed and Sealed this

Ninth Day of August 1983

[SEAL]

Attest:

GERALD J. MOSSINGHOFF

*Attesting Officer*     *Commissioner of Patents and Trademarks*